(12) United States Patent
Wu et al.

(10) Patent No.: US 11,367,713 B2
(45) Date of Patent: Jun. 21, 2022

(54) MICRO LIGHT EMITTING DEVICE DISPLAY APPARATUS

(71) Applicant: PlayNitride Display Co., Ltd., MiaoLi County (TW)

(72) Inventors: Chih-Ling Wu, MiaoLi County (TW); Yen-Yeh Chen, MiaoLi County (TW); Yi-Min Su, MiaoLi County (TW); Yi-Chun Shih, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 50 days.

(21) Appl. No.: 16/862,578

(22) Filed: Apr. 30, 2020

(65) Prior Publication Data

US 2020/0258869 A1 Aug. 13, 2020

Related U.S. Application Data

(63) Continuation-in-part of application No. 16/659,584, filed on Oct. 22, 2019, now Pat. No. 11,094,849.
(Continued)

(30) Foreign Application Priority Data

Oct. 13, 2017 (TW) .................................. 106135067
Dec. 30, 2019 (TW) .................................. 108148261

(51) Int. Cl.
| | |
|---|---|
| H01L 25/075 | (2006.01) |
| H01L 33/50 | (2010.01) |
| H01L 33/56 | (2010.01) |
| H01L 33/60 | (2010.01) |
| H01L 33/62 | (2010.01) |
| H01L 33/58 | (2010.01) |

(52) U.S. Cl.
CPC ........ *H01L 25/0753* (2013.01); *H01L 33/505* (2013.01); *H01L 33/56* (2013.01); *H01L 33/58* (2013.01); *H01L 33/60* (2013.01); *H01L 33/62* (2013.01); *H01L 2933/0091* (2013.01)

(58) Field of Classification Search
CPC ... H01L 25/0753; H01L 33/505; H01L 33/56; H01L 33/60; H01L 33/62; H01L 33/58; H01L 2933/0091; H01L 33/508; H01L 33/54
See application file for complete search history.

(56) References Cited

U.S. PATENT DOCUMENTS

| | | | |
|---|---|---|---|
| 2015/0340346 A1* | 11/2015 | Chu | H01L 24/97 257/89 |
| 2019/0189495 A1 | 6/2019 | Wu et al. | |
| 2019/0363000 A1 | 11/2019 | Wu et al. | |

FOREIGN PATENT DOCUMENTS

TW I671570 9/2019

OTHER PUBLICATIONS

"Office Action of Taiwan Counterpart Application", dated Sep. 8, 2020, p. 1-p. 5.

* cited by examiner

*Primary Examiner* — Thanh T Nguyen
(74) *Attorney, Agent, or Firm* — JCIPRNET

(57) ABSTRACT

A micro light emitting device display apparatus including a substrate, a plurality of micro light emitting devices, an isolation layer, and an air gap is provided. The micro light emitting devices are discretely disposed on the substrate. The isolation layer is disposed between the micro light emitting devices. The air gap is disposed between the micro light emitting devices, the isolation layer, and the substrate.

19 Claims, 11 Drawing Sheets

Related U.S. Application Data which is a continuation-in-part of application No. 15/869,098, filed on Jan. 12, 2018, now Pat. No. 10,490,536.

MICRO LIGHT EMITTING DEVICE DISPLAY APPARATUS

CROSS-REFERENCE TO RELATED APPLICATION

This application is a continuation-in-part application of and claims the priority benefit of U.S. application Ser. No. 16/659,584, filed on Oct. 22, 2019, now pending, which is a continuation-in-part application of and claims the priority benefit of U.S. application Ser. No. 15/869,098, filed on Jan. 12, 2018, now patented. The prior U.S. application Ser. No. 15/869,098 claims the priority benefit of Taiwan application serial no. 106135067, filed on Oct. 13, 2017. This application also claims the priority benefit of Taiwan application serial no. 108148261, filed on Dec. 30, 2019. The entirety of each of the above-mentioned patent applications is hereby incorporated by reference herein and made a part of this specification.

BACKGROUND OF THE INVENTION

Field of the Invention

The invention relates to a display device, and more particularly, to a micro light emitting device display apparatus.

Description of Related Art

In recent years, the manufacturing cost of an organic light emitting diode (OLED) display panel has been high and the service life thereof may not compete with current mainstream displays, and therefore a micro light emitting diode display (micro LED display) has gradually attracted investment from various technology companies. In particular, the micro light emitting diode display not only has optical performance equivalent to that of the organic light emitting diode display, such as high color saturation, fast response speed, and high contrast, but also has the advantages of low energy consumption and long material life. Therefore, the micro light emitting diode display is expected to become the mainstream display technique of the next generation.

However, in terms of current manufacturing techniques, the manufacturing yield of the micro light emitting diode display still needs to be improved. The main reason is that the manufacturing process of the micro light emitting diode display includes a step of die transposition, such as transferring micro light emitting diode dies pre-made on a temporary storage substrate to a circuit backplane of the display. Since the light emitting diode is miniaturized, the distance between two electrode pads is shortened as a result. When the micro light emitting diode is transferred and bonded to connection pads on the circuit backplane, the connection pads (such as conductive solders) need to be heated to a molten state. At this time, the two electrode pads of the micro light emitting diode are likely to be short-circuited due to the overflow of the connection pads, thus resulting in a decrease in transfer yield. In order to reduce the manufacturing cost of the micro light emitting diode display, it has become an urgent task for related manufacturers to solve the above issues.

SUMMARY OF THE INVENTION

The invention provides a micro light emitting device display apparatus having better transfer success rate.

A micro light emitting device display apparatus of the invention includes a substrate, a plurality of micro light emitting devices, an isolation layer, and an air gap. The micro light emitting devices are discretely disposed on the substrate. The isolation layer is disposed between the micro light emitting devices. The air gap is disposed between the micro light emitting devices, the isolation layer, and the substrate.

In an embodiment of the invention, the micro light emitting devices of the micro light emitting device display apparatus have a first width in a first direction. An area occupied by the air gap between two adjacent micro light emitting devices has a second width in the first direction, and the second width is less than the first width.

In an embodiment of the invention, a ratio of the second width to the first width of the micro light emitting device display apparatus is greater than or equal to 0.5.

In an embodiment of the invention, a portion of the isolation layer of the micro light emitting device display apparatus connected to the micro light emitting devices has a first height in a normal direction of the substrate. The micro light emitting devices have a second height in the normal direction of the substrate, and the first height is less than the second height.

In an embodiment of the invention, a ratio of the first height to the second height of the micro light emitting device display apparatus is greater than or equal to 0.5.

In an embodiment of the invention, a cross-sectional area of a portion of the isolation layer of the micro light emitting device display apparatus located between two adjacent micro light emitting devices is less than a cross-sectional area of the micro light emitting devices.

In an embodiment of the invention, a ratio of the cross-sectional area of the portion of the isolation layer of the micro light emitting device display apparatus located between the two adjacent micro light emitting devices to the cross-sectional area of the micro light emitting devices is less than 1 and greater than or equal to 0.5.

In an embodiment of the invention, the micro light emitting device display apparatus further includes a common electrode. The common electrode covers the isolation layer and is electrically connected to the micro light emitting devices. The common electrode and the air gap are respectively located on two opposite sides of the isolation layer.

In an embodiment of the invention, the micro light emitting devices of the micro light emitting device display apparatus have an epitaxial structure and a first-type electrode and a second-type electrode disposed on two opposite sides of the epitaxial structure. The common electrode includes a first-type common electrode layer and a second-type common electrode layer. The first-type common electrode layer covers the isolation layer and the plurality of micro light emitting devices and is directly in contact with the first-type electrode of each of the micro light emitting devices. The second-type common electrode layer is disposed between the micro light emitting devices and located between the first-type common electrode layer and the isolation layer. The second-type common electrode layer is electrically connected to the micro light emitting devices and the first-type common electrode layer.

In an embodiment of the invention, there is a first height between a surface of the second-type common electrode layer of the micro light emitting device display apparatus connected to the first-type common electrode layer and the substrate. There is a second height between a surface of the first-type electrode connected to the first-type common electrode layer and the substrate, and the first height is greater than the second height.

In an embodiment of the invention, the micro light emitting device display apparatus further includes a wavelength conversion layer disposed between the second-type common electrode layer. The isolation layer has a plurality of grooves correspondingly disposed on the plurality of micro light emitting devices, and the wavelength conversion layer is disposed in the grooves.

In an embodiment of the invention, a width of the micro light emitting devices of the micro light emitting device display apparatus in a first direction is reduced toward a direction away from the substrate, and the first direction is parallel to the substrate.

In an embodiment of the invention, the micro light emitting devices of the micro light emitting device display apparatus have a minimum width and a maximum width in a first direction, and a ratio of the minimum width to the maximum width of the micro light emitting devices is less than or equal to 0.5 and greater than or equal to 0.05.

In an embodiment of the invention, the micro light emitting devices of the micro light emitting device display apparatus have a maximum width in a first direction, two adjacent micro light emitting devices have a maximum pitch in the first direction, and the maximum pitch is less than the maximum width of the micro light emitting devices.

In an embodiment of the invention, a surface of the isolation layer of the micro light emitting device display apparatus defining the air gap is a curved surface concave toward the isolation layer.

In an embodiment of the invention, the isolation layer of the micro light emitting device display apparatus includes a reflective material, a scattering material, or a light-blocking material.

In an embodiment of the invention, each of the micro light emitting devices of the micro light emitting device display apparatus includes an epitaxial structure, a first-type electrode, and a second-type electrode. The first-type electrode and the second-type electrode are disposed on two opposite sides of the epitaxial structure. The first-type electrode is electrically connected to the common electrode. The second-type electrode has a surface facing the substrate. The isolation layer covers the surface of the second-type electrode, and connection pads of the substrate are electrically bonded to the surface of the second-type electrode via openings of the isolation layer.

In an embodiment of the invention, the isolation layer of the micro light emitting device display apparatus has a plurality of grooves correspondingly disposed on the plurality of micro light emitting devices.

In an embodiment of the invention, the micro light emitting device display apparatus further includes a wavelength conversion layer. The wavelength conversion layer is disposed between the isolation layer and disposed in the plurality of grooves of the isolation layer.

Based on the above, in the micro light emitting device display apparatus of an embodiment of the invention, the transfer success rate of the micro light emitting devices may be increased via the isolation layer disposed between the plurality of micro light emitting devices. Moreover, during the process of bonding the micro light emitting devices to the substrate, the connection pads on the substrate are heated to a molten state. At this time, the air gap located between the isolation layer and the substrate may be used as a buffer space when the connection pads are overflown to improve the bonding yield and flatness of the micro light emitting devices.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
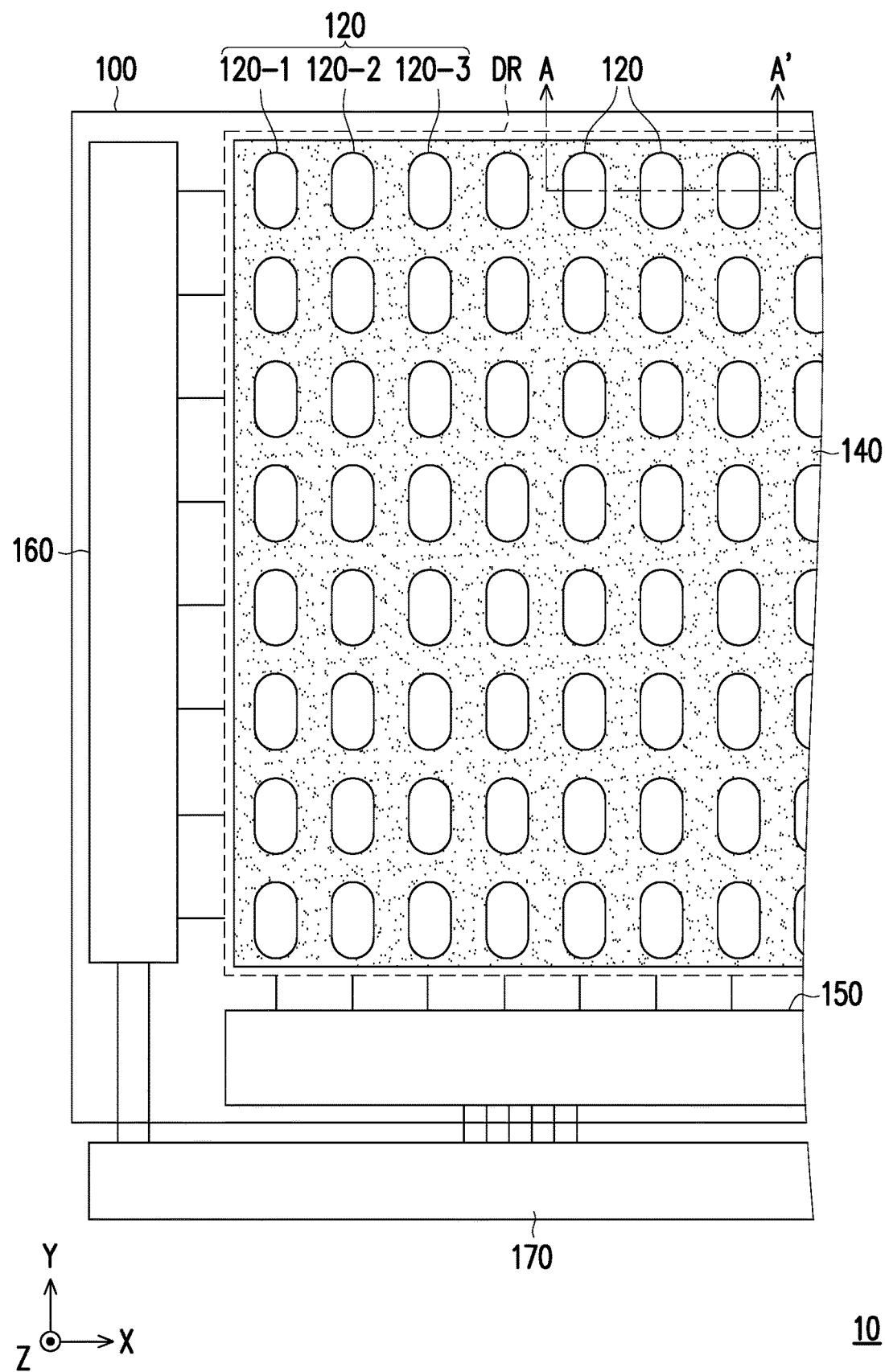
FIG. 1 is a top view of a micro light emitting device display apparatus of the first embodiment of the invention.

In the figures, for clarity, the thicknesses of, for instance, layers, films, panels, and regions are enlarged. It should be understood that, when a layer, film, region, or a device of a substrate is "on" another device or "connected to" another device, the device may be directly on the other device or connected to the other device, or an intermediate device may also be present. On the other hand, when a device is "directly on another device" or "directly connected to" another device, an intermediate device is not present. As used in the present specification, "connected to" may refer to a physical and/or electrical connection. Furthermore, "electrically connected" may mean that other devices are present between two devices.

Hereinafter, exemplary embodiments of the invention are described in detail, and examples of the exemplary embodiments are conveyed via the figures. Wherever possible, the same reference numerals are used in the figures and the descriptions to refer to the same or similar portions.

Figure 2:
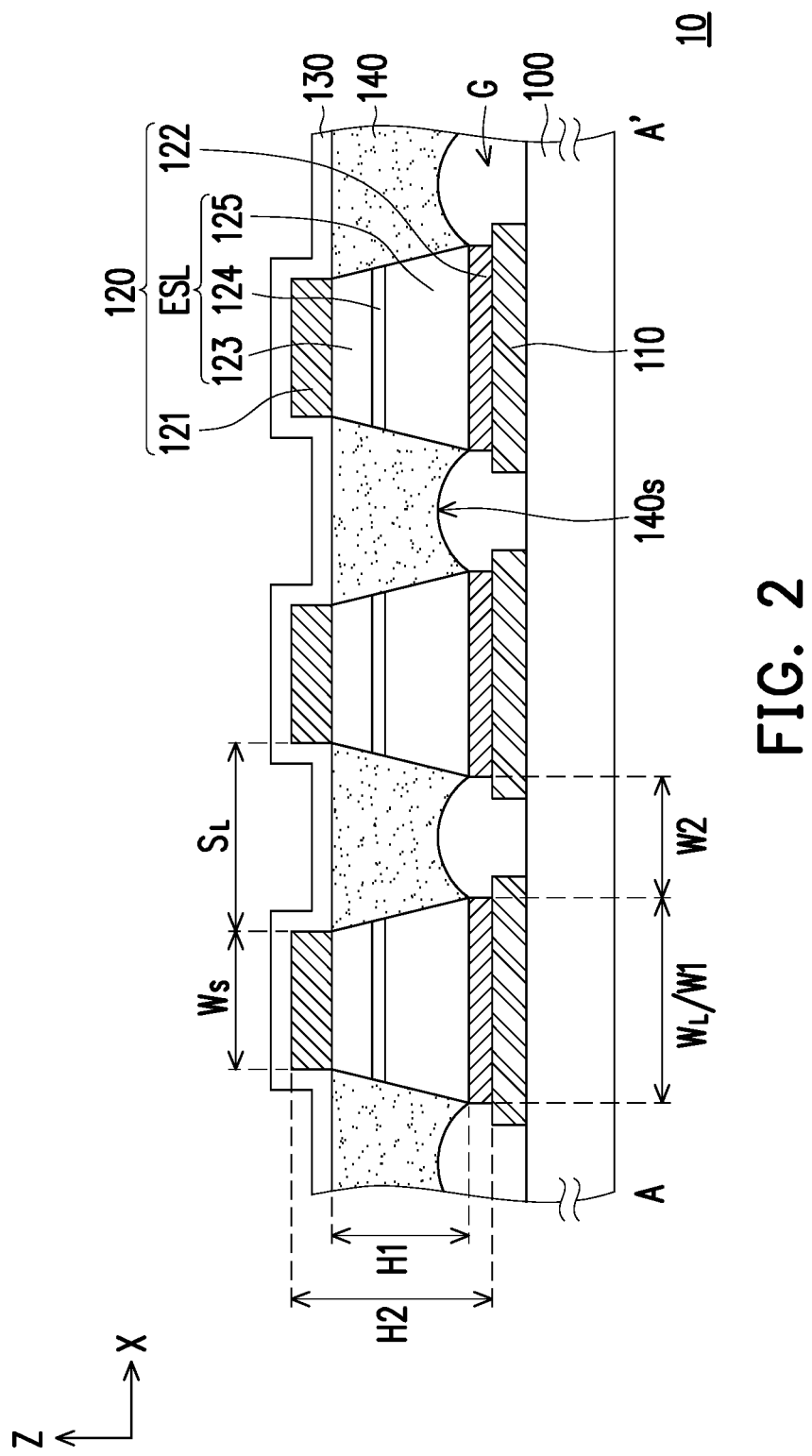
FIG. 2 is a cross-sectional view of the micro light emitting device display apparatus of FIG. 1.

FIG. 1 is a top view of a micro light emitting device display apparatus of the first embodiment of the invention. FIG. 2 is a cross-sectional view of the micro light emitting device display apparatus of FIG. 1. FIG. 2 corresponds to section line A-A' of FIG. 1. In particular, for the sake of clarity, FIG. 1 omits the illustration of connection pads 110 and a common electrode 130 of FIG. 2.

Referring to FIG. 1 and FIG. 2, a micro light emitting device display apparatus 10 includes a substrate 100, a plurality of micro light emitting devices 120, the common electrode 130, and an isolation layer 140. The micro light emitting devices 120 are discretely disposed on the substrate 100. The isolation layer 140 is disposed on the substrate 100 and located between the micro light emitting devices 120. The common electrode 130 covers the isolation layer 140 and is extended between the micro light emitting devices 120. More specifically, the common electrode 130 in the present embodiment comprehensively covers the isolation layer 140 and the plurality of micro light emitting devices 120 to be electrically connected to the micro light emitting devices 120, but is not limited thereto. The material of the common electrode 130 may include a transparent metal oxide, such as indium tin oxide (ITO), indium zinc oxide (IZO), aluminum tin oxide (ATO), aluminum zinc oxide (AZO), or other suitable oxides, or stacked layers of at least two of the above. Others may include silver, gold, chromium, copper, platinum, tin, nickel, titanium, aluminum, or an alloy of the above metals.

In the present embodiment, the substrate 100 is, for example, a circuit backplane of a display panel. That is, the micro light emitting device display apparatus 10 may be a display panel, but the invention is not limited thereto. The substrate 100 (i.e., the circuit backplane) has a plurality of connection pads 110 located in a display region DR of the display panel, and the micro light emitting devices 120 are respectively bonded to the connection pads 110 of the substrate 100. In other words, the micro light emitting devices 120 are electrically connected to the substrate 100 via the connection pads 110. In the present embodiment, the plurality of micro light emitting devices 120 (or the connection pads 110) are arranged on the substrate 100 along a direction X and a direction Y with an equal pitch. That is, the micro light emitting devices 120 may be arranged in an array on the substrate 100, but the invention is not limited thereto.

For example, the plurality of micro light emitting devices 120 may be a plurality of first micro light emitting devices 120-1, a plurality of second micro light emitting devices 120-2, and a plurality of third micro light emitting devices 120-3, and the light emitting colors of the first micro light emitting devices 120-1, the second micro light emitting devices 120-2, and the third micro light emitting devices 120-3 are red, green, and blue, respectively. In other embodiments, the light emitting colors of the plurality of micro light emitting devices 120 may be a combination of red, green, and blue. That is, the first micro light emitting devices 120-1, the second micro light emitting devices 120-2, and the third micro light emitting devices 120-3 of the present embodiment may form the display pixels of a display panel. However, the invention is not limited thereto. In other embodiments, the plurality of micro light emitting devices 120 may also emit light with the same wavelength, such as ultraviolet light or blue light.

Moreover, the substrate 100 in the present embodiment may include a driving circuit layer, wherein the driving circuit layer includes a transistor device, a capacitor, a scan line, a data line, and a power line, and the connection pads 110 are, for example, a portion of the data line or conductive patterns connected to the data line. That is, the driving circuit layer may be an active driving circuit layer, but the invention is not limited thereto. According to other embodiments, the driving circuit layer may also not include a transistor device. That is, the driving circuit layer may also be a passive driving circuit layer.

In detail, the micro light emitting devices 120 include an epitaxial structure ESL, a first-type electrode 121, and a second-type electrode 122. The first-type electrode 121 and the second-type electrode 122 are disposed on two opposite side surfaces of the epitaxial structure ESL, and are electrically connected to the common electrode 130 and the connection pads 110, respectively. In the present embodiment, the first-type electrode 121 may be a light-transmissive electrode, and the material of the light-transmissive electrode may include a metal oxide, such as indium tin oxide, indium zinc oxide, aluminum tin oxide, aluminum zinc oxide, or other suitable oxides, or stacked layers of at least two of the above. The material of the second-type electrode 122 may include platinum, nickel, titanium, gold, silver, chromium, an alloy of the above metals, a high work function metal of a combination of the above alloys, a metal oxide, or a non-metallic conductive material such as a conductive polymer, graphite, graphene, or black phosphorus.

Further, the epitaxial structure ESL includes a first-type semiconductor layer 123, a light emitting layer 124, and a second-type semiconductor layer 125. The first-type semiconductor layer 123 is located between the first-type electrode 121 and the light emitting layer 124, and the first-type semiconductor layer 123 is electrically connected to the common electrode 130 via the first-type electrode 121. The second-type semiconductor layer 125 is located between the second-type electrode 122 and the light emitting layer 124, and the second-type semiconductor layer 125 is electrically connected to the connection pads 110 via the second-type electrode 122. More specifically, the second-type electrode 122, the epitaxial structure ESL, and the first-type electrode 121 of the present embodiment are sequentially disposed on the substrate 100. That is, the micro light emitting devices 120 of the present embodiment are vertical-type micro light emitting diodes.

Moreover, the first-type semiconductor layer 123 in the present embodiment is, for example, a P-type semiconductor layer, and the second-type semiconductor layer 125 is, for example, an N-type semiconductor layer. However, the invention is not limited thereto. According to other embodiments, the first-type semiconductor layer 123 may also be an N-type semiconductor layer, and the second-type semiconductor layer 125 may also be a P-type semiconductor layer. For example, the thickness of the first-type semiconductor layer 123 may be between 0.05 microns and 0.5 microns, the thickness of the light emitting layer 124 may be between 0.1 microns and 1 micron, and the thickness of the second-type semiconductor layer 125 may be between 1 micron and 5 microns. Accordingly, the overall thickness of the epitaxial structure ESL may be controlled between 1 micron and 6 microns to ensure the yield of subsequent processes and the characteristics of the end product.

In the present embodiment, the isolation layer 140 located between the plurality of micro light emitting devices 120 is directly disposed on two sidewalls of the epitaxial structure ESL of the micro light emitting devices 120 to be connected to the micro light emitting devices 120, but the invention is not limited thereto. In particular, the isolation layer 140 is formed before the micro light emitting devices 120 are transferred to the substrate 100. For example, when the micro light emitting devices 120 are transferred onto a temporary substrate, the isolation layer 140 connected to the micro light emitting devices may be formed on the temporary substrate. Accordingly, the configuration of the isolation layer 140 may prevent the micro light emitting devices 120 from shifting during the transfer to increase the transfer success rate, thus improving the overall yield of the micro light emitting device display apparatus 10 (or display panel).

For example, a portion of the isolation layer 140 connected to the micro light emitting devices 120 has a height H1 in a normal direction (for example, a direction Z) of the substrate 100, the micro light emitting devices 120 have a height H2 in the direction Z, and the height H1 of the isolation layer 140 is less than the height H2 of the micro light emitting devices 120. In the present embodiment, the ratio of the height H1 of the isolation layer 140 to the height H2 of the micro light emitting devices 120 is greater than or equal to 0.5. Accordingly, the generation of sufficient connection force between the isolation layer 140 and the plurality of micro light emitting devices 120 may be ensured to improve the transfer success rate of the micro light emitting devices 120. In the present embodiment, the material of the isolation layer 140 may include an insulating material such as a light-sensitive material (such as a photoresist), a heat-sensitive material (such as a polymer glue), silicon oxide ($SiO_x$), aluminum oxide ($Al_2O_3$), aluminum nitride (AlN), or silicon nitride ($SiN_x$), but is not limited thereto.

From another point of view, the cross-sectional area of the portion of the isolation layer 140 located between two adjacent micro light emitting devices 120 (for example, a vertical projection area on the XZ plane) is less than the cross-sectional area of the micro light emitting devices 120 (for example, a vertical projection area on the XZ plane). In the present embodiment, the ratio of the cross-sectional area of the portion of the isolation layer 140 located between the two adjacent micro light emitting devices 120 to the cross-sectional area of the micro light emitting devices 120 is less than 1 and greater than or equal to 0.5. Accordingly, the generation of sufficient connection force between the isolation layer 140 and the plurality of micro light emitting devices 120 may be ensured to improve the transfer success rate of the micro light emitting devices 120.

Further, the micro light emitting devices 120 have a maximum width $W_L$ and a minimum width $W_S$ in the direction X, and the ratio of the minimum width $W_S$ to the maximum width $W_L$ of the micro light emitting devices 120 is less than or equal to 0.5 and greater than or equal to 0.05, but is not limited thereto. In the present embodiment, the connection surface of the epitaxial structure ESL (or the first-type semiconductor layer 123) and the first-type electrode 121 may define the minimum width $W_S$ of the micro light emitting devices 120, and the connection surface of the epitaxial structure ESL (or the second-type semiconductor layer 125) and the second-type electrode 122 may define the maximum width $W_L$ of the micro light emitting devices 120. More specifically, the width of the epitaxial structure ESL of the micro light emitting devices 120 in the direction X may be reduced from the second-type electrode 122 toward the direction of the first-type electrode 121 (i.e., toward the direction away from the substrate 100), so that the cross-sectional profile of the epitaxial structure ESL is a positive trapezoid with a narrow top and a wide bottom to increase the process margin of the common electrode 130 in a later process.

Moreover, two adjacent micro light emitting devices 120 arranged in the direction X have a maximum pitch $S_L$ in the direction X, and this maximum pitch $S_L$ may be less than the maximum width $W_L$ of the micro light emitting devices 120. Accordingly, the micro light emitting device display apparatus 10 may have a higher pixel resolution. However, the invention is not limited thereto. According to other embodiments, the maximum distance $S_L$ between two adjacent micro light emitting devices 120 may also be greater than or equal to the maximum width $W_L$ of the micro light emitting devices 120.

In the present embodiment, the maximum width $W_L$ of the micro light emitting devices 120 may be between 1 micron and 100 microns, preferably between 1 micron and 30 microns. In a preferred embodiment, the maximum width $W_L$ of the micro light emitting devices 120 is less than 10 microns. In another preferred embodiment, the maximum width $W_L$ of the micro light emitting devices 120 is less than 5 microns. It is worth mentioning that when the maximum width $W_L$ of the micro light emitting devices 120 is less than 10 microns, the micro light emitting devices 120 are prone to shift during the transfer process via a transfer head (not shown). Therefore, via the connection relationship between the isolation layer 140 and the micro light emitting devices 120, the uniformity requirements of the adhesive force (or adsorption force) between a plurality of transfer heads and the plurality of micro light emitting devices 120 on the carrier board structure may be lowered. In other words, the process margin of the micro light emitting devices 120 during transfer may be increased, and shifting to the micro light emitting devices 120 may be prevented.

Further, the micro light emitting device display apparatus 10 further includes an air gap G disposed between the substrate 100, the plurality of micro light emitting devices 120, and the isolation layer 140. It should be mentioned that, during the process of bonding the micro light emitting devices 120 to the substrate 100, the connection pads 110 on the substrate 100 are heated to a molten state. At this time, the air gap G between the substrate 100 and the isolation layer 140 may be used as a buffer space for the overflow of the connection pads 110 to improve the bonding yield and flatness of the micro light emitting devices 120. In the present embodiment, the isolation layer 140 has a surface 140s defining the air gap G, and the surface 140s may be a curved surface concave toward the isolation layer 140 to define a larger buffer space, but the invention is not limited thereto. In other embodiments, the surface of the isolation layer defining the air gap may also be a convex surface, and the convex surface may be used as a blocking structure to block the overflow of the connection pads 110 in the buffer space.

Moreover, the micro light emitting devices 120 have a width W1 in a direction parallel to the arrangement direction (for example, the direction X), the area occupied by the air gap G located between two adjacent micro light emitting devices 120 has a width W2 in the direction X, and the width W2 of the air gap G is less than the width W1 of the micro light emitting devices 120. In the present embodiment, the ratio of the width W2 of the air gap G to the width W1 of the micro light emitting devices 120 is greater than 0.5, but the invention is not limited thereto. In other embodiments, the ratio of the width W2 of the air gap G to the width W1 of the micro light emitting devices 120 may also be substantially equal to 0.5. Accordingly, the generation of sufficient connection force between the isolation layer 140 and the plurality of micro light emitting devices 120 may be ensured to improve the transfer success rate of the micro light emitting devices 120. At the same time, short circuit of the second-type electrode 122 of two adjacent micro light emitting devices 120 caused by the overflow of the connection pads 110 may also be avoided.

In the present embodiment, the substrate 100 may be a circuit substrate such as a display substrate, a light emitting substrate, a substrate with a functional element such as a thin-film transistor or an integrated circuit (IC), or other types of circuit substrates, but the invention is not limited thereto. The micro light emitting device display apparatus 10 may further include a first driving circuit 150 and a second driving circuit 160 respectively disposed on the substrate 100. For example, a transistor device used to control the display pixels (that is, the micro light emitting devices 120) is respectively electrically connected to the first driving circuit 150 (such as a gate driving circuit) and the second driving circuit 160 (for example, a source driving circuit) via a scan line and a data line. Moreover, the micro light emitting device display apparatus 10 may further include a driving circuit board 170, and the driving circuit board 170 may be electrically bonded to one side of the substrate 100 to be electrically connected to the first driving circuit 150 and the second driving circuit 160. For example, the driving circuit board 170 may be electrically connected to the substrate 100 via a flexible printed circuit board (FPCB; not shown), but the invention is not limited thereto.

It should be noted that, in the present embodiment, the number of driving circuits is two as an example, but the invention is not limited by the contents disclosed in the figures. In other embodiments, the micro light emitting device display apparatus may further include a power control circuit or other circuits (e.g., a feedback circuit, a compensation circuit, etc.) suitable for driving display pixels. It should be understood that the micro light emitting device display apparatus may further include a signal line electrically connected to the driving circuit.

In the following, other embodiments are provided to explain the disclosure in detail. The same components are labeled with the same reference numerals, and the description of the same technical content is omitted. For the omitted portions, please refer to the foregoing embodiments, which are not described again below.

Figure 3:
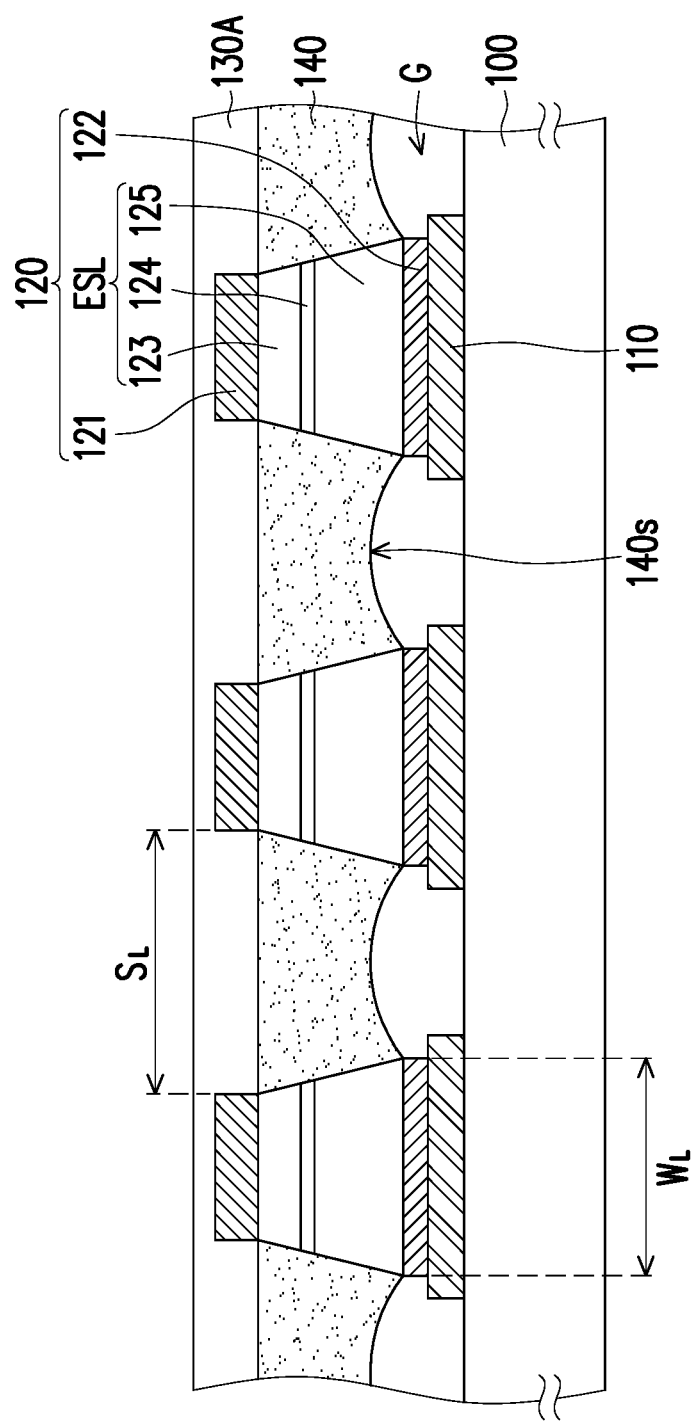
FIG. 3 is a cross-sectional view of a micro light emitting device display apparatus of the second embodiment of the invention.
Figure 4A:
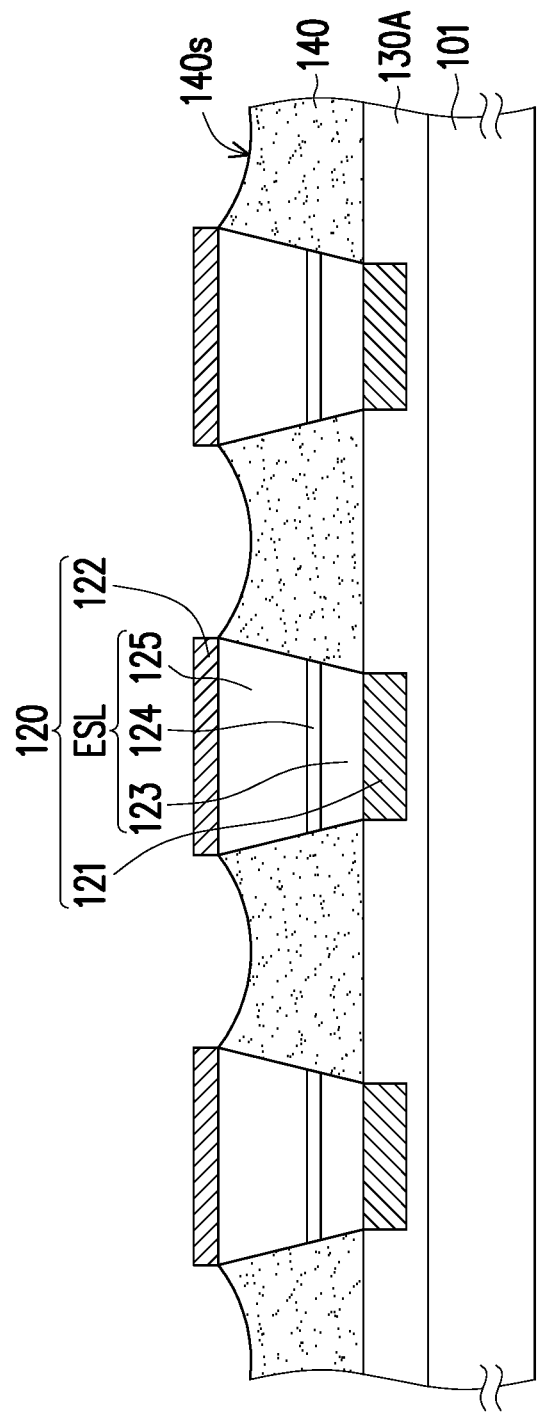
FIG. 4A and FIG. 4B are cross-sectional views of a manufacturing process of the micro light emitting device display apparatus of FIG. 3.
Figure 4B:
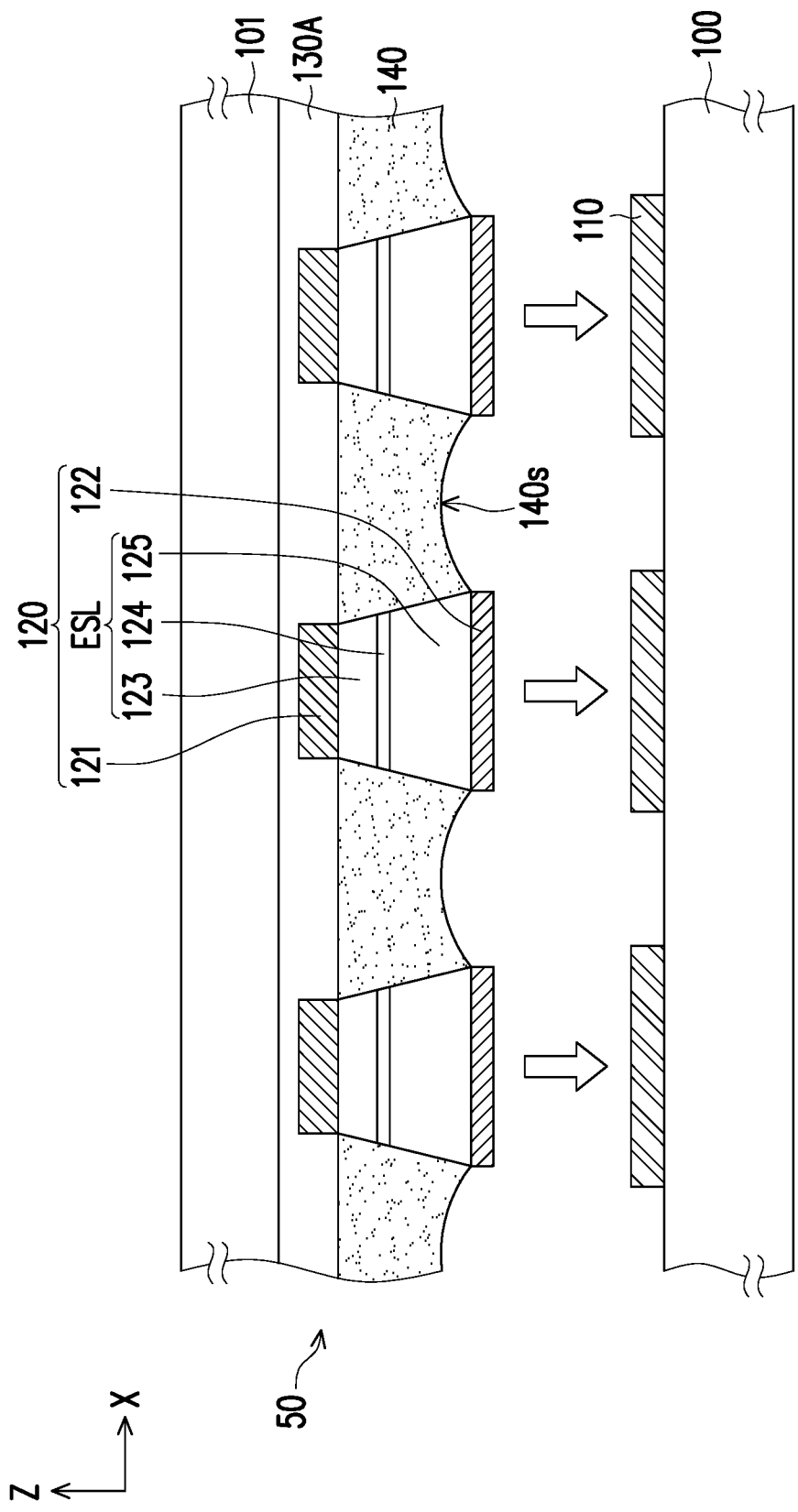
Figure 5:
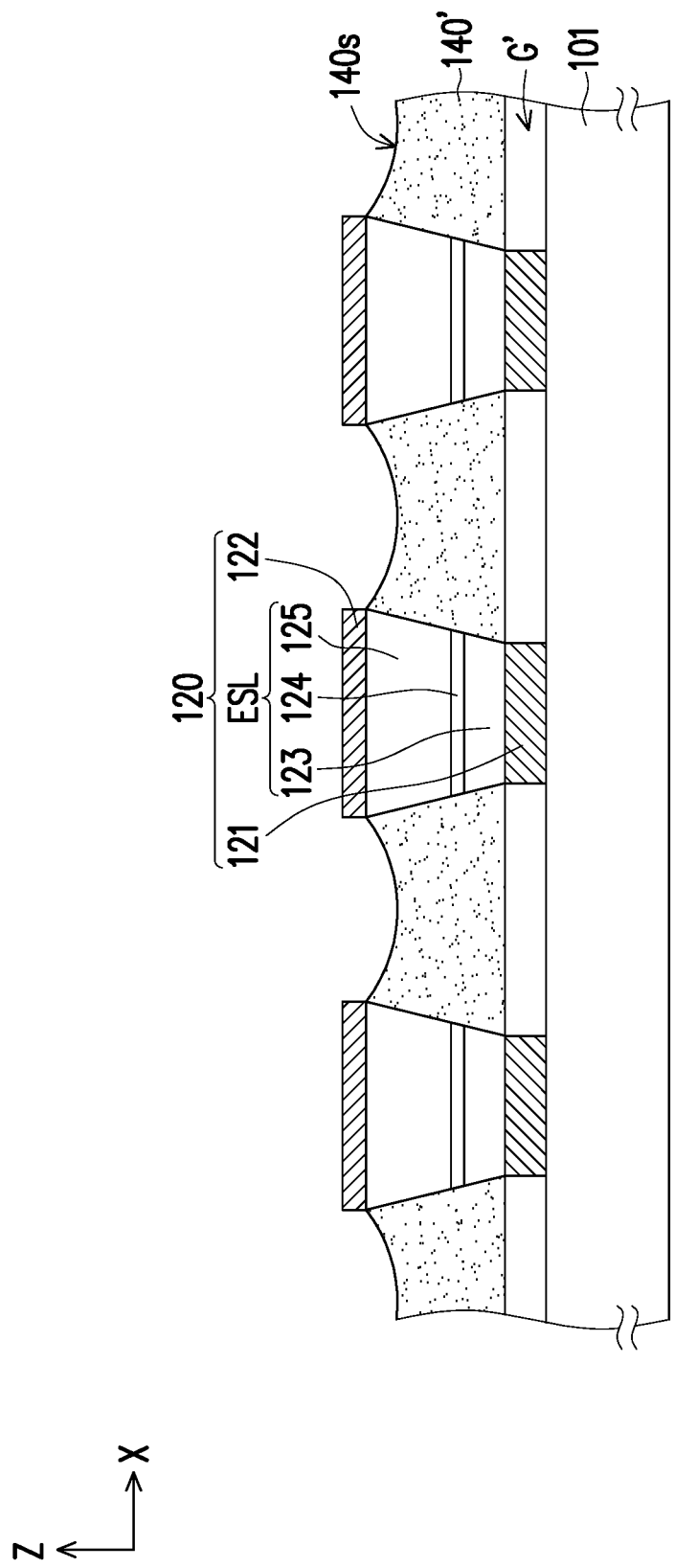
FIG. 5 is a cross-sectional view of a micro light emitting device carrier board structure of another embodiment of the invention.

FIG. 3 is a cross-sectional view of a micro light emitting device display apparatus of the second embodiment of the invention. FIG. 4A and FIG. 4B are cross-sectional views of a manufacturing process of the micro light emitting device display apparatus of FIG. 3. FIG. 5 is a cross-sectional view of a micro light emitting device carrier board structure of another embodiment of the invention. Referring to FIG. 2 and FIG. 3, the main difference between a micro light emitting device display apparatus 11 of the present embodiment and the micro light emitting device display apparatus 10 of FIG. 2 is that the structure of the common electrode is different. Specifically, the portion of a common electrode 130A of the micro light emitting device display apparatus 11 located between the plurality of micro light emitting devices 120 has a greater thickness in the direction Z than the common electrode 130 of the micro light emitting device display apparatus 10. Accordingly, the current conduction efficiency of the common electrode 130A of the micro light emitting device display apparatus 11 may be further improved. Moreover, in the present embodiment, the maximum distance $S_L$ between two adjacent micro light emitting devices 120 arranged in the direction X is greater than the maximum width $W_L$ of the micro light emitting devices 120, but the invention is not limited thereto.

It is worth mentioning that the common electrode 130A of the present embodiment is formed before the plurality of micro light emitting devices 120 are transferred to the substrate 100. Referring to FIG. 4A and FIG. 4B, for example, the steps of forming the micro light emitting device display apparatus 11 may include: providing a micro light emitting device carrier board structure 50 (as shown in FIG. 4A) and flipping the micro light emitting device carrier board structure 50 and bringing it close to the substrate 100 so that the plurality of micro light emitting devices 120 are bonded to the plurality of connection pads 110 of the substrate 100 (as shown in FIG. 4B). That is, the micro light emitting device carrier board structure 50 here may be used as a carrier board structure for forming the micro light emitting device display apparatus 10. The above steps are exemplarily described below.

First, referring to FIG. 4A, the steps of forming the micro light emitting device carrier board structure 50 include providing a temporary substrate 101, transferring the plurality of micro light emitting devices 120 onto the temporary substrate 101, forming the common electrode 130A between the temporary substrate 101 and the plurality of micro light emitting devices 120, and forming the isolation layer 140 between the plurality of micro light emitting devices 120. The temporary substrate 101 may be a temporary substrate such as a plastic substrate, a glass substrate, or a sapphire substrate, and may not be provided with a circuit thereon, so that the micro light emitting devices 120 are easily transferred to the substrate 101 later. For example, in the present embodiment, the common electrode 130A is formed before the transfer step of the micro light emitting devices 120, but the invention is not limited thereto. In an embodiment, the common electrode may be formed after the micro light emitting devices 120 are transferred to the temporary substrate 101. In another embodiment, the carrier board structure of the micro light emitting devices 120 transferred onto the temporary substrate 101 may also not have a common electrode, as shown in FIG. 5. That is, the common electrode is formed after the plurality of micro light emitting devices 120 are transferred to the substrate 100. It is worth noting that since the micro light emitting device carrier board structure 50 does not have a common electrode, there is an air gap G' between the isolation layer 140, the first-type electrode 121 of the micro light emitting devices 120, and the temporary substrate 101, and the air gap G' may be used as a buffer space when the micro light emitting devices 120 are transferred to the temporary substrate 101.

Please continue to refer to FIG. 4A. After the common electrode 130A is formed, the isolation layer 140 is formed between the plurality of micro light emitting devices 120. The common electrode 130A is located between the temporary substrate 101 and the isolation layer 140. The isolation layer 140 covers two opposite sidewalls of the common electrode 130A and the epitaxial structure ESL. It is worth noting that the side surface 140s of the isolation layer 140 in the present embodiment away from the temporary substrate 101 may be a curved surface concave toward the isolation layer 140. However, the invention is not limited thereto. According to other embodiments, the surface 140s of the isolation layer 140 may also have different surface shapes according to different material selection or process conditions.

Please refer to FIG. 4B. During the process of bonding the micro light emitting device carrier structure 50 to the connection pads 110 on the substrate 100, the air gap G formed between the plurality of micro light emitting devices 120, the isolation layer 140, and the substrate 100 (as shown in FIG. 3) may be used as a buffer space when the connection pads 110 are heated and overflown, so as to improve the bonding yield and flatness of the micro light emitting devices 120. Since the surface 140s of the isolation layer 140 defining the air gap G is a curved surface concave toward the isolation layer 140, a larger buffer space may be provided for the overflow of the connection pads 110. Moreover, the connection relationship of the isolation layer 140 and the micro light emitting devices 120 may effectively increase the transfer success rate of the micro light emitting devices 120.

Figure 6:
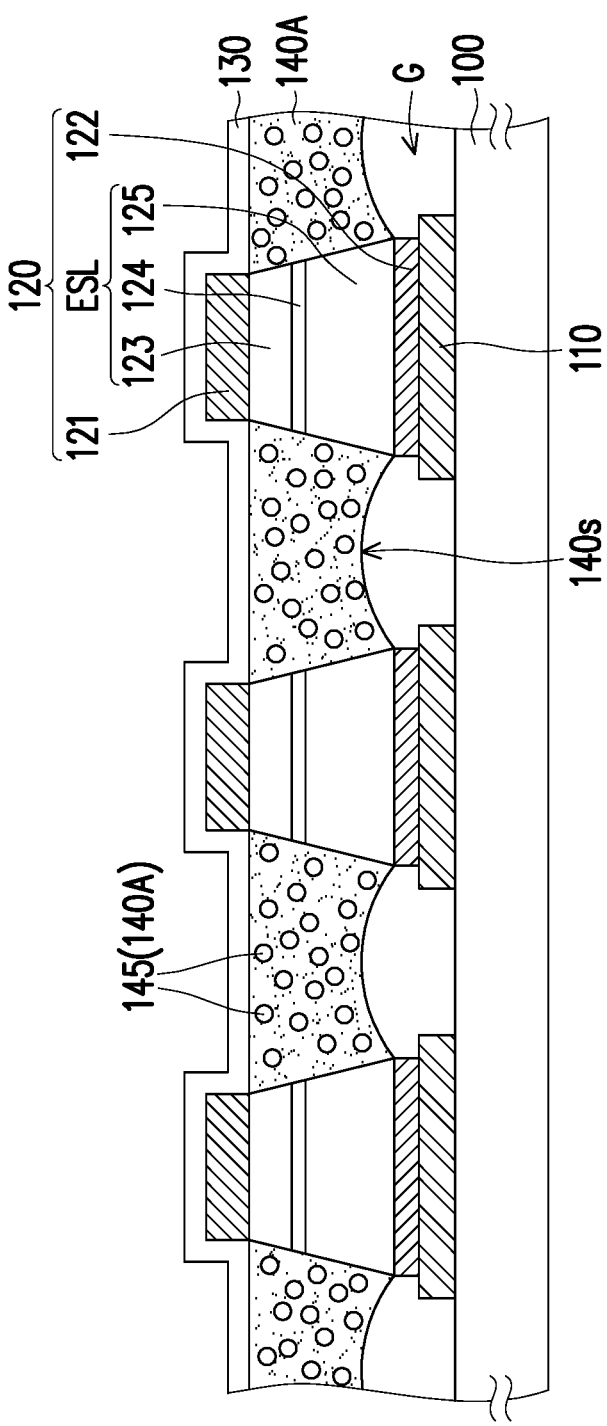
FIG. 6 is a cross-sectional view of a micro light emitting device display apparatus of the third embodiment of the invention.

FIG. 6 is a cross-sectional view of a micro light emitting device display apparatus of the third embodiment of the invention. Referring to FIG. 6, the main difference between a micro light emitting device display apparatus 12 of the present embodiment and the micro light emitting device display apparatus 10 of FIG. 2 is that the composition of the isolation layer is different. Specifically, an isolation layer 140A of the micro light emitting device display apparatus 12 has a reflective material, a scattering material, or a light-blocking material. In the present embodiment, the isolation layer 140A is, for example, an insulating material such as silicon dioxide or aluminum nitride, and includes reflective particles 145. The material of the reflective particles 145 may include metal particles.

For example, when the micro light emitting device display apparatus 12 is enabled, after a portion of the light beam emitted by the epitaxial structure ESL (or the light emitting layer 124) of the micro light emitting devices 120 is incident on the isolation layer 140A, the light beam may be reflected by the reflective particles 145 dispersed in the isolation layer 140A and transmitted back to the epitaxial structure ESL to increase the amount of forward light emitted by the micro light emitting devices 120. However, the invention is not limited thereto. In other embodiments, the material of the isolation layer may also be a light-absorbing material, such as a black resin material. Accordingly, overlap of the light emission ranges of the plurality of adjacent micro light emitting devices 120 may be prevented, so as to achieve a high-resolution display effect.

Figure 7:
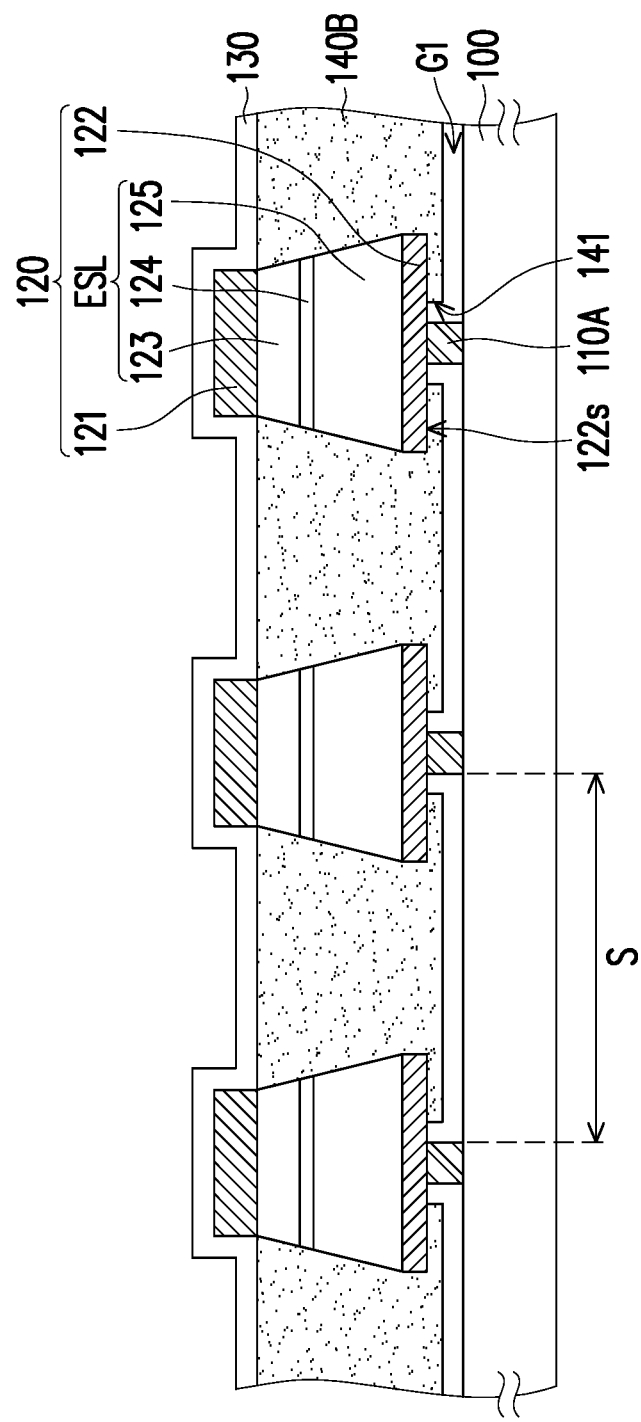
FIG. 7 is a cross-sectional view of a micro light emitting device display apparatus of the fourth embodiment of the invention.

FIG. 7 is a cross-sectional view of a micro light emitting device display apparatus of the fourth embodiment of the invention. Referring to FIG. 7, the main difference between a micro light emitting device display apparatus 13 of the present embodiment and the micro light emitting device display apparatus 10 of FIG. 2 is that the structures of the isolation layer and the connection pads are different. Specifically, an isolation layer 140B of the micro light emitting device display apparatus 13 also covers a surface 122s of the second-type electrode 122 of the micro light emitting devices 120 facing the substrate 100 and has openings 141 overlapped with connection pads 110A. The connection pads 110A are electrically connected to the surface 122s of the second-type electrode 122 of the micro light emitting devices 120 via the openings 141 of the isolation layer 140B. It is worth mentioning that in the present embodiment, since the contact area of the isolation layer 140B and the micro light emitting devices 120 is greater, the connection relationship of the plurality of micro light emitting devices 120 and the isolation layer 140B may be more stable to further improve the transfer success rate of the micro light emitting devices 120. The design of the openings may also locate the joint of the second-type electrode 122 and the connection pads 110A in the central region of the micro light emitting devices 120. Even if the connection pads 110A are melted and overflown due to heat and pressure during the transfer process, the connection pads 110A do not flow to the side surface of the second-type electrode 122, thus avoiding the issue of side leakage.

Moreover, the connection pads 110A of the present embodiment have a smaller width than the connection pads 110 of FIG. 2 in a direction (e.g., the direction X) parallel to the substrate 100. In other words, there is a greater pitch S between two adjacent connection pads 110A arranged in the direction X to avoid electrical short circuit caused when the two adjacent connection pads 110A are overflown. Moreover, an air gap G1 located between the isolation layer 140B and the substrate 100 may be used as a buffer space when the connection pads 110A are overflown to improve the bonding yield and flatness of the micro light emitting devices 120.

Figure 8:
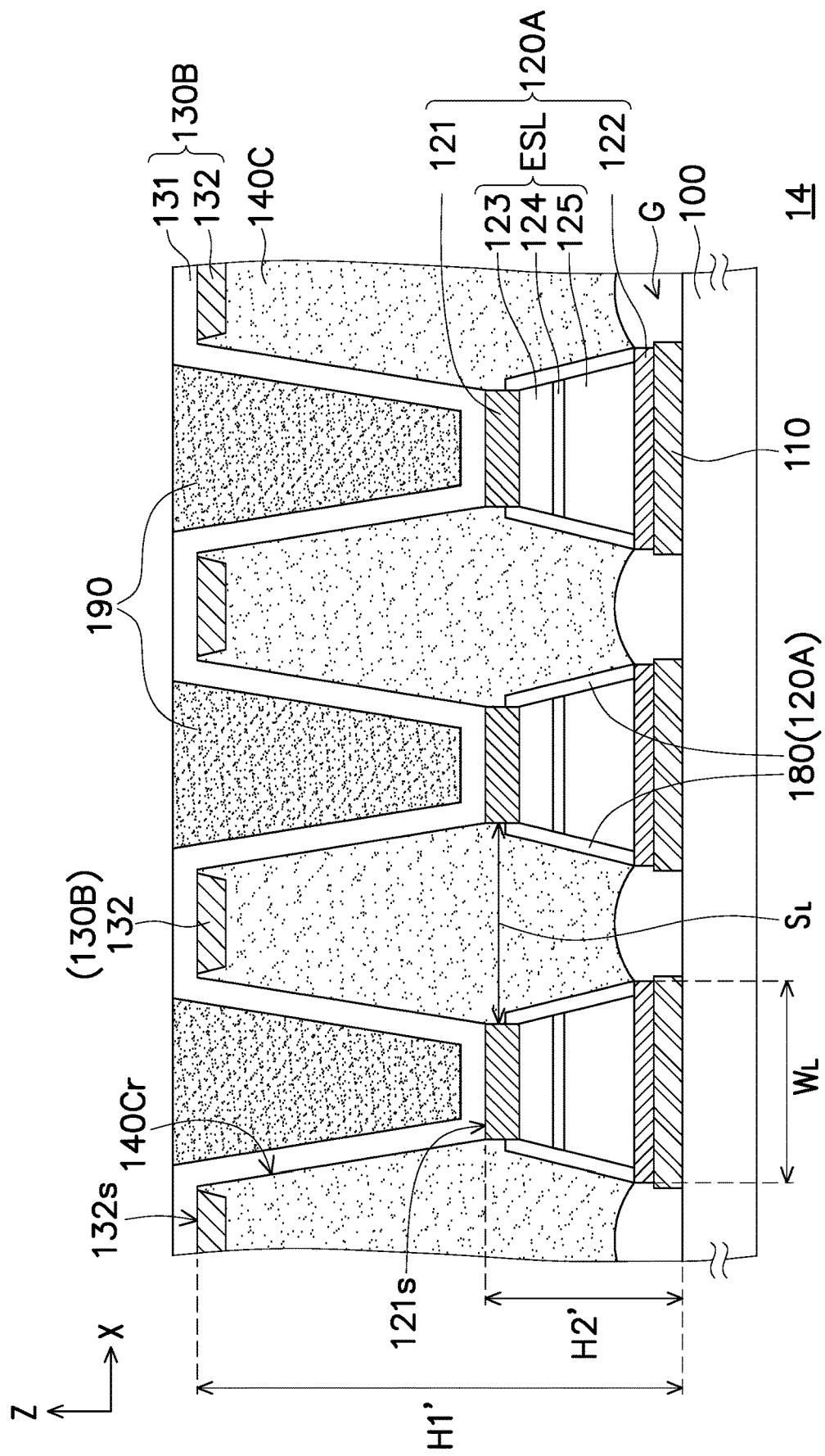
FIG. 8 is a cross-sectional view of a micro light emitting device display apparatus of the fifth embodiment of the invention.

FIG. 8 is a cross-sectional view of a micro light emitting device display apparatus of the fifth embodiment of the invention. Referring to FIG. 8, the main difference between a micro light emitting device display apparatus 14 of the present embodiment and the micro light emitting device display apparatus 10 of FIG. 2 is that the structure of the isolation layer, the composition of the micro light emitting devices, the composition of the common electrode, and the composition of the micro light emitting device display apparatus are different. In the present embodiment, an isolation layer 140C has a plurality of grooves 140Cr, and the grooves 140Cr are overlapped with a plurality of micro light emitting devices 120A in the direction Z. A common electrode 130B includes a first-type common electrode layer 131 and a second-type common electrode layer 132 electrically connected to each other. The first-type common electrode layer 131 is disposed on the isolation layer 140C and extended into the grooves 140Cr to be electrically connected to the first-type electrode 121 of the micro light emitting devices 120A. The second-type common electrode layer 132 is disposed between the micro light emitting devices 120A and sandwiched between the first-type common electrode layer 131 and the isolation layer 140C.

Specifically, in the present embodiment, the conductivity of the second-type common electrode layer 132 may be higher than the conductivity of the first-type common electrode layer 131. For example, the material of the first-type common electrode layer 131 may include a transparent metal oxide, such as indium tin oxide (ITO), indium zinc oxide (IZO), aluminum tin oxide (ATO), aluminum zinc oxide (AZO), or other suitable oxides, or stacked layers of at least two of the above. The material of the second-type common electrode layer 132 may include silver, gold, chromium, copper, platinum, tin, nickel, titanium, aluminum, or an alloy of the above metals. Since the second-type common electrode layer 132 of the common electrode 130B is made of a metal material, the ratio of the conductivity of the second-type common electrode layer 132 to the conductivity of the first-type common electrode layer 131 may be in a range of 10 to 100. Accordingly, the overall resistance value of the common electrode 130B may be effectively reduced so that the current conduction efficiency of the common electrode 130B may be improved.

In the present embodiment, there is a height H1' between a surface 132s of the second-type common electrode layer 132 connected to the first-type common electrode layer 131 and the substrate 100, there is a height H2' between the surface 121s of the first-type electrode 121 of the micro light emitting devices 120A connected to the first-type common electrode the layer 131 and the substrate 100, and the height H1' of the second-type common electrode layer 132 is greater than the height H2' of the first-type electrode 121 of the micro light emitting devices 120A, but the invention is not limited thereto. The height H1' of the second-type common electrode layer 132 is greater than the height H2' of the first-type electrode 121 to block the large-angle light emission of the micro light emitting devices 120A, thereby preventing the emission ranges of adjacent micro light emitting devices 120A from overlapping with each other, so as to achieve high-resolution display effects.

Moreover, the micro light emitting device display apparatus 14 further includes a wavelength conversion layer 190 disposed in the plurality of grooves 140Cr, and the first-type common electrode layer 131 is located between the isolation layer 140C and the wavelength conversion layer 190. For example, the micro light emitting devices 120A of the present embodiment are used to emit a single wavelength of excitation light (such as blue light or ultraviolet light), and the excitation light is irradiated on the wavelength conversion layer 190 to excite red light, green light, or other visible light. However, the invention is not limited thereto. According to other embodiments, a color filter layer may also be provided in the grooves 140Cr of the isolation layer 140C to filter the visible light emitted by the micro light emitting devices 120A into a desired color light.

In the present embodiment, the maximum pitch $S_L$ between two adjacent micro light emitting devices 120A in the direction X may be less than the maximum width $W_L$ of micro light emitting devices 120B in the direction X. In other words, the micro light emitting device display apparatus 14 of the present embodiment may be a micro light emitting diode display panel having a higher pixel resolution. Moreover, the micro light emitting devices 120A may further include an insulating layer 180 disposed between the isolation layer 140C and the epitaxial structure ESL. The insulating layer 180 may directly cover the epitaxial structure ESL and a portion of the sidewall of the first-type electrode 121. Accordingly, a leakage current may be prevented from being generated at the connection surface of the epitaxial structure ESL and the isolation layer 140C. More specifically, electrical independence of the epitaxial structures ESL of any two adjacent micro light emitting devices 120A may be ensured. In an embodiment not shown, the insulating layer may also cover only the epitaxial structure ESL so that the first-type electrode 121 and the common electrode 130B have a greater electrical connection area.

Figure 9:
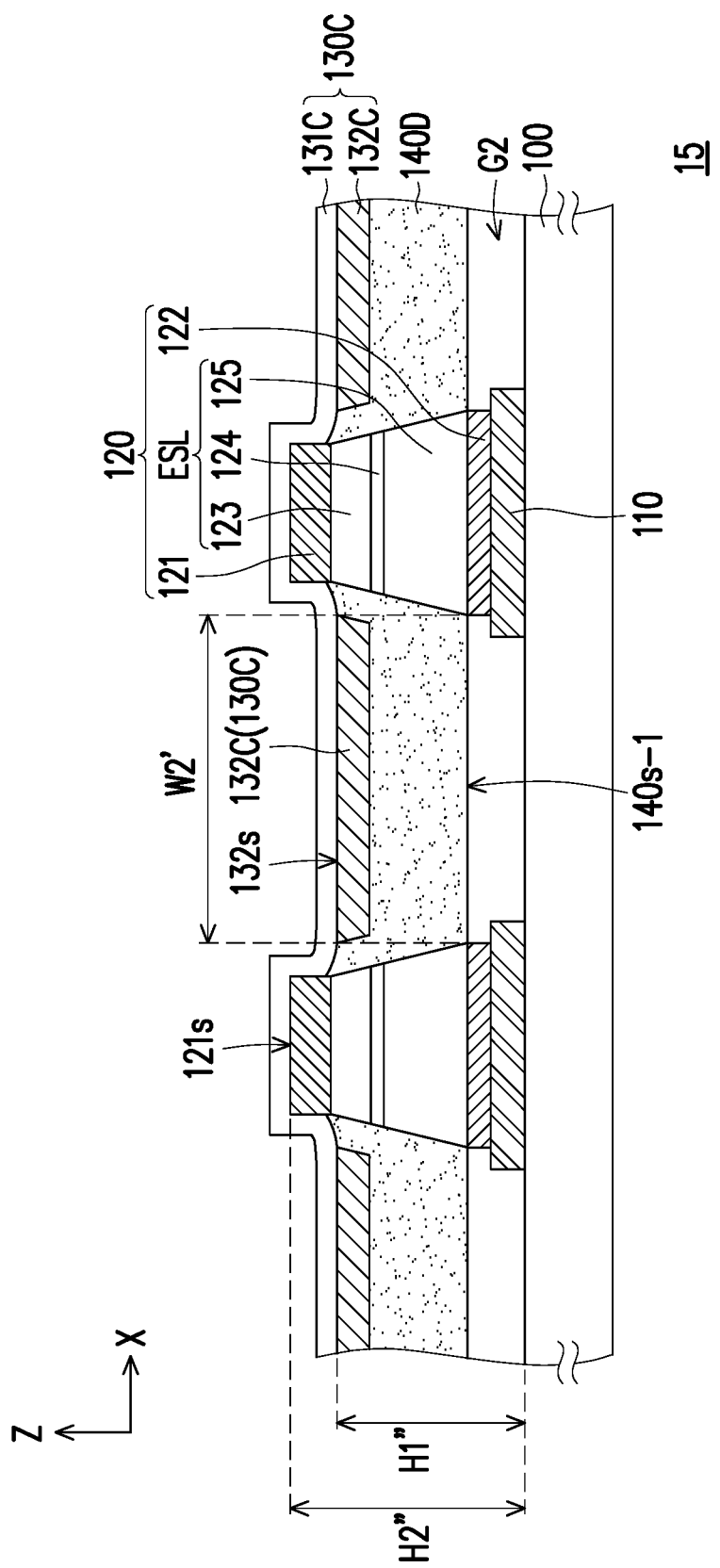
FIG. 9 is a cross-sectional view of a micro light emitting device display apparatus of the sixth embodiment of the invention.

FIG. 9 is a cross-sectional view of a micro light emitting device display apparatus of the sixth embodiment of the invention. Please refer to FIG. 9. The main differences between a micro light emitting device display apparatus 15 of the present embodiment and the micro light emitting device display apparatus 10 of FIG. 1 and FIG. 2 are: the composition and arrangement of the common electrode are different, and the shape of the surface of the isolation layer defining the air gap is different. In the present embodiment, a common electrode 130C includes a first-type common electrode layer 131C and a second-type common electrode layer 132C electrically connected to each other. The first-type common electrode layer 131C directly covers an isolation layer 140D and the first-type electrode 121 of the micro light emitting devices 120 to be electrically connected to the micro light emitting devices 120. The second-type common electrode layer 132C is disposed between the micro light emitting devices 120 and sandwiched between the first-type common electrode layer 131C and the isolation layer 140D.

In the present embodiment, there is a height H1" between the surface 132s of the second-type common electrode layer 132C connected to the first-type common electrode layer 131C and the substrate 100, there is a height H2" between the surface 121s of the first-type electrode 121 of the micro light emitting devices 120 connected to the first-type common electrode the layer 131C and the substrate 100, and the height H1" of the second-type common electrode layer 132C is less than the height H2" of the first-type electrode 121 of the micro light emitting devices 120, but the invention is not limited thereto.

Moreover, the isolation layer 140D may also cover a portion of the sidewall of the first-type electrode 121 of the micro light emitting devices 120, and a surface 140s-1 of the isolation layer 140D defining an air gap G2 may be a plane, but the invention is not limited thereto. It is worth noting that, compared with the air gap G of FIG. 2, the air gap G2 of the present embodiment has a greater width W2' in the direction X, wherein the width W2' may be greater than the pitch between two adjacent connection pads 110. The volume of the air gap G2 may also be respectively greater than the volume of the connection pads 110 of the substrate 100 and the second-type electrode 122 of each of the micro light emitting devices 120. Accordingly, during the bonding process of the micro light emitting devices 120 and the connection pads 110 of the substrate 100, a greater buffer space may be provided for the overflow of the connection pads 110.

Figure 10:
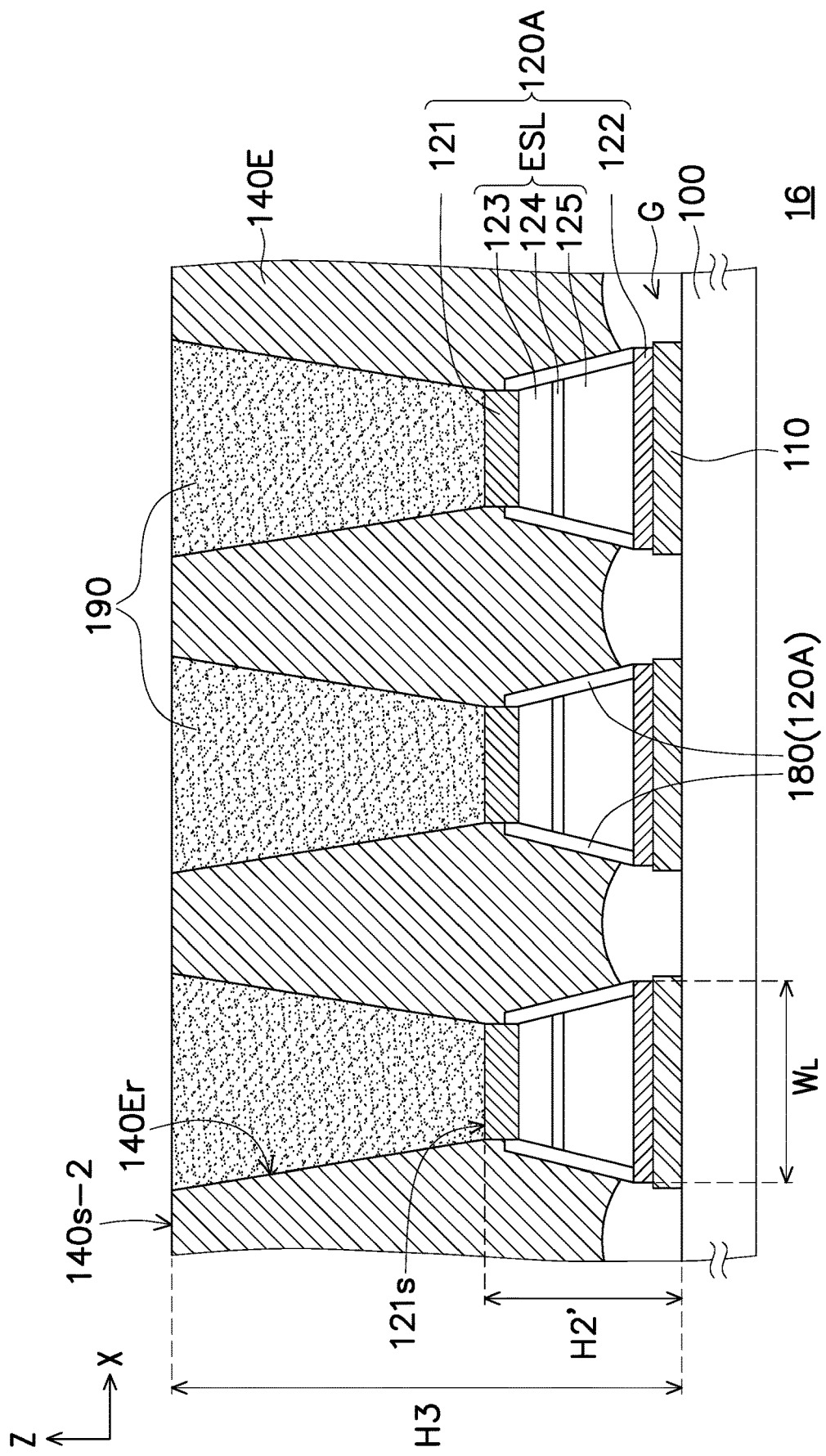
FIG. 10 is a cross-sectional view of a micro light emitting device display apparatus of the seventh embodiment of the invention.

FIG. 10 is a cross-sectional view of a micro light emitting device display apparatus of the seventh embodiment of the invention. Referring to FIG. 10, the main difference between a micro light emitting device display apparatus 16 of the present embodiment and the micro light emitting device display apparatus 14 of FIG. 8 is that the material and structure of the isolation layer and the composition of the micro light emitting device display apparatus are different. In the present embodiment, an isolation layer 140E has a plurality of grooves 140Er, and the grooves 140Er are overlapped with the plurality of micro light emitting devices 120A in the direction Z. It should be mentioned that, the material of the isolation layer 140E may be a material having reflective and conductive properties such as silver, gold, chromium, copper, platinum, tin, nickel, titanium, aluminum, or an alloy of the above metals. Therefore, the light emitted from two adjacent micro light emitting devices 120A may be prevented from interfering with each other, and the isolation layer 140E may also be used as a common electrode with good conduction efficiency.

Moreover, by electrically connecting the first-type electrode 121 of the micro light emitting devices 120A via the isolation layer 140E located between the plurality of micro light emitting devices 120A, a decrease in the amount of forward light due to the common electrode disposed on the light emitting surface (for example, the surface 121s of the first electrode 121) may be prevented. However, the invention is not limited thereto. In an embodiment not shown, a second-type common electrode layer (not shown) may also be disposed on the isolation layer 140E and extended into the grooves 140Er to be electrically connected to the first-type electrode 121 of the micro light emitting devices 120A.

In the present embodiment, there is a height H3 between a surface 140s-2 of the isolation layer 140E and the substrate 100, and the height H3 of the isolation layer 140E is greater than the height H2' of the first-type electrode 121 to block the large-angle light emission of the micro light emitting devices 120A, thereby preventing the emission ranges of adjacent micro light emitting devices 120A from overlapping with each other, so as to achieve high-resolution display effects.

Moreover, the wavelength conversion layer 190 of the micro light emitting device display device 16 is disposed in the plurality of grooves 140Er. For example, the micro light emitting devices 120A of the present embodiment are used to emit a single wavelength of excitation light (such as blue light or ultraviolet light), and the excitation light is irradiated on the wavelength conversion layer 190 to excite red light, green light, or other visible light. However, the invention is not limited thereto. According to other embodiments, a color filter layer may also be provided in the grooves 140Er of the isolation layer 140E to filter the visible light emitted by the micro light emitting devices 120A into a desired color light.

Based on the above, in the micro light emitting device display apparatus of an embodiment of the invention, the transfer success rate of the micro light emitting devices may be increased via the isolation layer disposed between the plurality of micro light emitting devices. Moreover, during the process of bonding the micro light emitting devices to the substrate, the connection pads on the substrate are heated to a molten state. At this time, the air gap located between the isolation layer and the substrate may be used as a buffer space when the connection pads are overflown to improve the bonding yield and flatness of the micro light emitting devices.

What is claimed is:

1. A micro light emitting device display apparatus, comprising:
   a substrate, having a plurality of connection pads;
   a plurality of micro light emitting devices discretely disposed on the substrate;
   an isolation layer disposed between the micro light emitting devices; and
   an air gap disposed between the micro light emitting devices, the isolation layer, and the substrate, wherein the air gap exposes the connection pads.

2. The micro light emitting device display apparatus of claim 1, wherein the micro light emitting devices have a first width in a first direction, an area occupied by the air gap between two adjacent micro light emitting devices has a second width in the first direction, and the second width is less than the first width.

3. The micro light emitting device display apparatus of claim 2, wherein a ratio of the second width to the first width is greater than or equal to 0.5.

4. The micro light emitting device display apparatus of claim 1, wherein a portion of the isolation layer connected to the micro light emitting devices has a first height in a normal direction of the substrate, the micro light emitting devices have a second height in the normal direction of the substrate, and the first height is less than the second height.

5. The micro light emitting device display apparatus of claim 4, wherein a ratio of the first height to the second height is greater than or equal to 0.5.

6. The micro light emitting device display apparatus of claim 1, wherein a cross-sectional area of a portion of the isolation layer located between two adjacent micro light emitting devices is less than a cross-sectional area of the micro light emitting devices.

7. The micro light emitting device display apparatus of claim 6, wherein a ratio of the cross-sectional area of the portion of the isolation layer located between the two adjacent micro light emitting devices to the cross-sectional area of the micro light emitting devices is less than 1 and greater than or equal to 0.5.

8. The micro light emitting device display apparatus of claim 1, further comprising a common electrode covering the isolation layer and electrically connected to the micro light emitting devices, and the common electrode and the air gap are respectively located on two opposite sides of the isolation layer.

9. The micro light emitting device display apparatus of claim 8, wherein the micro light emitting devices have an epitaxial structure and a first-type electrode and a second-type electrode disposed on two opposite sides of the epitaxial structure, the common electrode comprising:
   a first-type common electrode layer covering the isolation layer and the micro light emitting devices and directly in contact with the first-type electrode of each of the micro light emitting devices; and
   a second-type common electrode layer disposed between the micro light emitting devices and located between the first-type common electrode layer and the isolation layer, wherein the second-type common electrode layer is electrically connected to the micro light emitting devices and the first-type common electrode layer.

10. The micro light emitting device display apparatus of claim 9, wherein there is a first height between a surface of the second-type common electrode layer connected to the first-type common electrode layer and the substrate, there is a second height between a surface of the first-type electrode connected to the first-type common electrode layer and the substrate, and the first height is greater than the second height.

11. The micro light emitting device display apparatus of claim 10, further comprising:
   a wavelength conversion layer disposed between the second-type common electrode layer, wherein the isolation layer has a plurality of grooves correspondingly disposed on the micro light emitting devices, and the wavelength conversion layer is disposed in the grooves.

12. The micro light emitting device display apparatus of claim 8, wherein each of the micro light emitting devices comprises:
   an epitaxial structure; and
   a first-type electrode and a second-type electrode disposed on two opposite sides of the epitaxial structure, wherein the first-type electrode is electrically connected to the common electrode, the second-type electrode has a surface facing the substrate, the isolation layer covers the surface of the second-type electrode, and connection pads of the substrate are electrically bonded to the surface of the second-type electrode via openings of the isolation layer.

13. The micro light emitting device display apparatus of claim 8, further comprising: a wavelength conversion layer disposed between the isolation layer, and the wavelength conversion layer is disposed in the grooves of the isolation layer.

14. The micro light emitting device display apparatus of claim 1, wherein a width of the micro light emitting devices in a first direction is reduced toward a direction away from the substrate, and the first direction is parallel to the substrate.

15. The micro light emitting device display apparatus of claim 14, wherein the micro light emitting devices have a minimum width and a maximum width in the first direction, and a ratio of the minimum width to the maximum width of the micro light emitting devices is less than or equal to 0.5 and greater than or equal to 0.05.

16. The micro light emitting device display apparatus of claim 1, wherein the micro light emitting devices have a maximum width in a first direction, two adjacent micro light emitting devices have a maximum pitch in the first direction, and the maximum pitch is less than the maximum width of the micro light emitting devices.

17. The micro light emitting device display apparatus of claim 1, wherein a surface of the isolation layer defining the air gap is a curved surface concave toward the isolation layer.

18. The micro light emitting device display apparatus of claim 1, wherein the isolation layer comprises a reflective material, a scattering material, or a light-blocking material.

19. The micro light emitting device display apparatus of claim 1, wherein the isolation layer has a plurality of grooves correspondingly disposed on the micro light emitting devices.

* * * * *